SHIELDED ELECTRICAL ATTENUATOR ASSEMBLY

Filed Aug. 19, 1963 2 Sheets-Sheet 1

WILLEM B. VELSINK
INVENTOR.
BY
BUCKHORN, BLORE, KLARQUIST & SPARKMAN
ATTORNEYS

SHIELDED ELECTRICAL ATTENUATOR ASSEMBLY

Filed Aug. 19, 1963

WILLEM B. VELSINK
INVENTOR.

BY
BUCKHORN, BLORE, KLARQUIST & SPARKMAN
ATTORNEYS

United States Patent Office 3,215,959
Patented Nov. 2, 1965

3,215,959
SHIELDED ELECTRICAL ATTENUATOR ASSEMBLY

Willem B. Velsink, Beaverton, Oreg., assignor to Tektronix, Inc., Beaverton, Oreg., a corporation of Oregon
Filed Aug. 19, 1963, Ser. No. 302,950
7 Claims. (Cl. 333—81)

The subject of the present invention relates generally to electrical signal attenuators, and in particular to shielded attenuator assemblies which may include a plurality of separate RC attenuator sections having different attenuation ratios, a switch mechanism for connecting one of such attenuator sections between the input and output terminals of an electrical circuit and a common shield member supported between the input and output stages of each attenuator section to reduce the wave form distortion and to increase the frequency response of such attenuator sections.

The shielded attenuator assembly of the present invention is especially useful when employed in the input stage of the vertical amplifier system of a cathode ray oscilloscope. When high voltage pulses of fast rise time or high frequency are applied to conventional RC attenuators, the resulting high input surge current produces circulating currents in the attenuator section which cause distortion of the output signal wave form. This distortion is primarily due to the mutual inductance between input and output stages of the attenuator section and to the common inductance of leads which are located in a current path common to the input and output stages of such attenuator sections.

The attenuator assembly of the present invention has several advantages over conventional RC attenuators, including reduced mutual inductance and common inductance which is the result of the use of a shield member between the input and output stages of the attenuator sections of such assembly. The common inductance of the attenuator sections of the present invention is further reduced by employing a feed through type capacitor as the output capacitor of such attenuator sections, and mounting such capacitor so that it extends through an opening in such shield member. In addition, the present shielded attenuator assembly also provides separate ground paths for the circulating currents flowing in the input and output stages of the attenuator sections on opposite sides of the shield member due to the "skin effect" at high frequencies to reduce any previous distortion due to the voltage drop caused by such currents across the impedance of common ground paths. Another advantage is the simplified construction of the present attenuator assembly made possible by the use of a single common shield member between the input and output stages of all the attenuator sections in such assembly.

It is therefore one object of the present invention to provide an improved electrical signal attenuator having a better high frequency response.

Another object of the invention is to provide an improved electrical attenuator having less distortion and better high frequency response by employing a shield member between the input stage and the output stage of the attenuator to reduce the mutual inductance and the common inductance between such stages.

A further object of the present invention is to provide an improved electrical attenuator having resistors and capacitors in its input and output stages in which a shield member is employed between the input and output stages and a feed through type capacitor is mounted to extend through an opening in such shield member to function as the output capacitor of such output stage in order to reduce the distortion of input signals of fast rise time or high frequency.

An additional object of the invention is to provide an improved shielded attenuator assembly of simplified construction in which a single common shield member is employed between the input and output stages of each of a plurality of different attenuator sections in such assembly.

Other objects and advantages of the present invention will be apparent from the following detailed description of a preferred embodiment thereof and from the attached drawings, of which:

Figure 1:
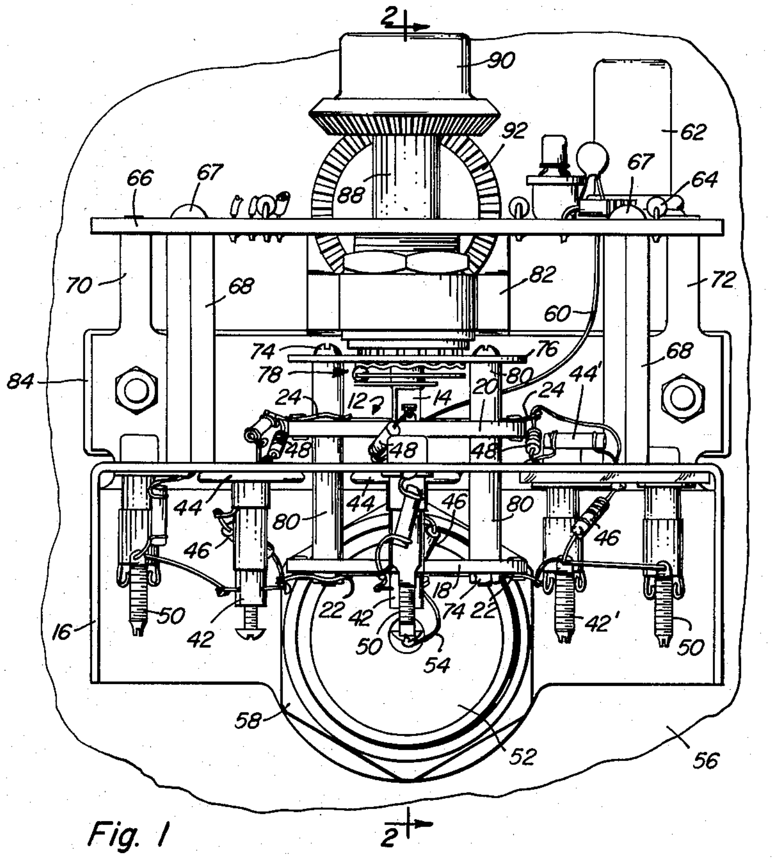
FIG. 1 is a plan view of an attenuator assembly in accordance with the present invention.
Figure 2:
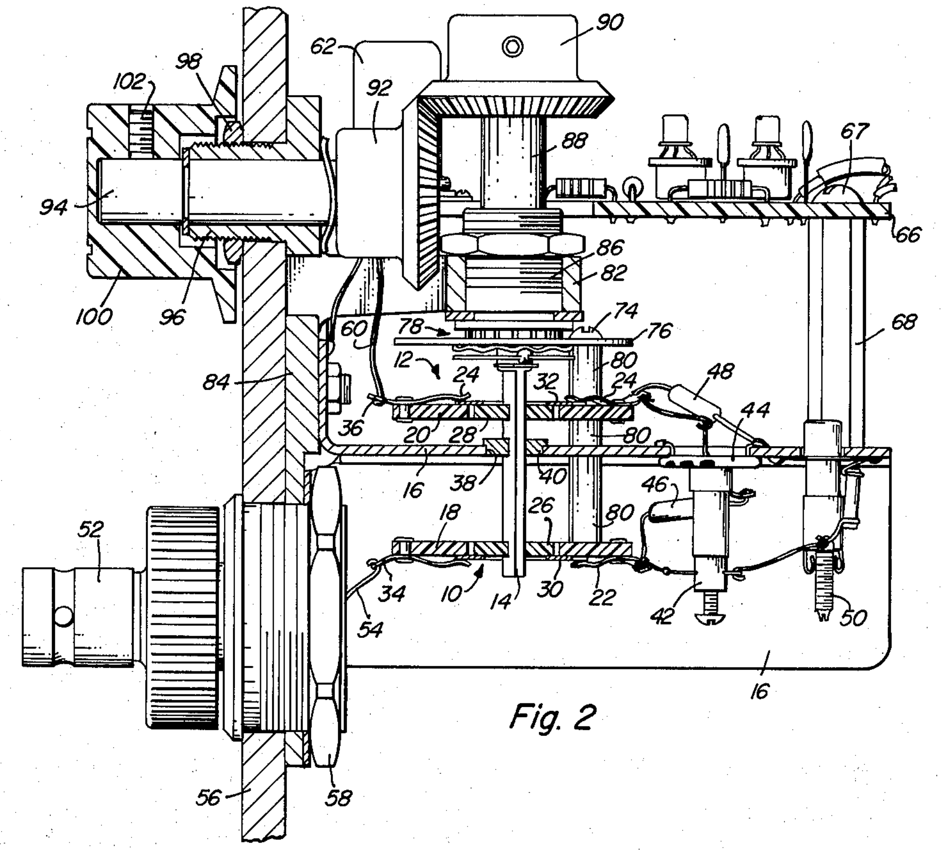
FIG. 2 is a partial section view taken along the line 2—2 of FIG. 1.

As shown in FIGS. 1 and 2, one embodiment of the electrical attenuator assembly of the present invention includes the input switch 10 and an output switch 12 which are connected together by a common switch shaft 14 and supported on opposite sides of a common shield member 16. The input and output switches 10 and 12 may be conventional wafer type switches each including an outer stator member 18 and 20, respectively, of insulating material having fixed switch contacts 22 and 24, respectively, suitably fastened to said stator member by rivets or the like. Each of the input and output switches also includes a rotor member 26 and 28, respectively, of insulating material which is mounted within a circular opening in the stator member coplanar therewith, and is provided with one or more movable contacts 30 and 32 mounted on such rotor members for rotation therewith. The movable contacts 30 and 32 of the input and output switches are positioned so that they are always in engagement with fixed contacts connected to the input and output terminals 34 and 36, respectively, of the attenuator assembly. Such movable contacts are each provided with a projection for engaging one of the other fixed contacts 22 and 24 on such switches in order to connect the input and output terminals to different attenuator sections. The switch shaft 14 may be provided with a flattened end portion which extends through the shield member 16 and through a rectangular opening in each of the rotor members 26 and 28 keyed to such shaft for rotation of the movable contacts of such input and output switches together.

Each of the other fixed contacts 22 and 24 is connected to different ones of a plurality of separate attenuator sections of different attenuation ratios so that rotation of the rotor members of the input and output switches 10 and 12 connects one of such attenuator sections between the input terminal 34 and the output terminal 36 of the attenuator assembly. Each of the attenuator sections includes an input stage and an output stage mounted on opposite sides of the shield member 16, which may be made of brass or other suitable metal in the form of a U-shaped plate having a small aperture 38 therein to enable the switch shaft 14 to extend through to such shield member. The metal employed is preferably non-magnetic and should have sufficient electrical conductance that rapidly changing magnetic fields will not penetrate the shield. A bushing 40 may be attached to the flattened switch shaft 14 for rotation therewith and provided with a circular outer surface which is in sliding contact with the interior surface of the aperture 38 in order to provide a continuous shield member for better magnetic shielding.

The input stage of each of the attenuator sections may include a variable input capacitor 42 whose input terminal is connected to one of the fixed contacts 22 of the stator member 18 of the input switch. The other side of the input capacitor is connected to one end of the inner conductor or plate of a feed through capacitor 44 which may be of the mica button type and is mounted in an opening through the central portion of shield member 16. The other end of the inner conductor of the feed through capacitor 14 is connected to one of the fixed contacts 24 on the stator member 20 of the output switch 12 so that such feed through capacitor functions as the output capacitor in the output stage of the attenuator. The outer conductor or plate of the feed through capacitor is mounted in contact with the grounded shield member 16 so that the outer plate of the feed through capacitor is connected to ground. The input stage of each of the attenuator sections may also be provided with an input resistor 46 connected in parallel with the input capacitor 42 between one of the fixed switch contacts 22 and the output terminal of such capacitor. In a similar manner, an output resistor 48 may be connected in the output stage between one of the fixed switch contacts 24 and the shield member in parallel with the feed through capacitor 44. In addition, a shunt capacitor 50 may be provided to compensate for the variable input capacitor 42 to maintain the input capacitance of the attenuator sections constant. This shunt capacitor is connected between the input terminal of the attenuator section and the grounded shield member 16.

It should be noted that the input and output stages of the attenuator sections may be provided with any number of resistors, capacitors and even inductors connected in series and parallel without affecting the principle of the present invention. For example, a fixed capacitor may be connected in parallel with the variable shunt capacitor 50 and the output end of the inner conductor of the feed through capacitor 44 may be connected through another fixed capacitor to the switch contact 24 functioning as the output of the attenuator section, as is shown in FIG. 1. In this regard, the feed through capacitor 44 may be replaced by a standard fixed capacitor 44′ having its input terminal connected to a lead wire extending through an opening in the shield member 16 and attached to the output terminal of another type of variable input capacitor 42′, and having its output terminal connected to the shield 16. However, this latter attenuator section which does not use a feed through capacitor as the output capacitor has greater common inductance than attenuator sections employing such feed through capacitors. Also, such section has a common ground path for circulating currents in the input and output stages which produces a voltage drop across the resistance of such common ground path so that this second type of attenuator section does not have as good a high frequency response.

The input signal to the attenuator assembly may be transmitted through a coaxial cable connector 52 whose inner conductor is connected through an input lead 54 to the input terminal 34 on the stator member of the input switch 10. The coaxial connector 52 which may be of the BNC type extends through a hole in a mounting panel 56 on the front of the oscilloscope and through an opening in the front end of the shield member 16 and is clamped to such panel and such shield member by means of a nut 58 threaded onto the outer conductor of such connector. The output signal of the attenuator assembly is transmitted from the output terminal 36 on the stator member of the output switch 12 through an output lead 60 to a load impedance which may be a vacuum tube 62. Tube 62 may be connected as a cathode follower amplifier with its grid connected to lead 60, its anode connected to a source of positive D.C. supply voltage and its cathode connected to ground through a load resistor 64. The cathode follower tube 64 and other components of the vertical preamplifier of the oscilloscope may be mounted on the printed circuit board 66 which is attached to the shield member 16 by means of a pair of bolts 67 threaded into spacer sleeves 68 positioned between such circuit board and such shield member. The front end of the printed circuit board 66 is provided with a pair of holes through which extend projections on arm portions 70 and 72 of the shield member.

The stator members 18 and 20 of the input and output switches are secured by a pair of bolts 74 extending through a pair of holes on opposite sides of such stator members and through the shield member 16 and a support plate 76 forming part of a switch detent mechanism 78 for indexing the position of the switch shaft. A plurality of spacer sleeves 80 are positioned around the bolts 74 between the stator members and the shield and between the support plate and stator member 20. The detent mechanism 78 including the support plate 76, is rigidly secured to a collar portion 82 of a switch frame 84. The switch shaft 14 extends through a bushing 86 inside the collar 82 and is suitably attached to one end of a second switch shaft 88 of larger diameter so that rotation of such second shaft causes the first shaft 14 and the rotor members keyed thereto to also rotate. The other end of the second switch shaft is attached to a first bevel gear 90 whose teeth mesh with a second bevel gear 92 mounted on the end of a third switch shaft 94 extending at right angles to the second shaft. The third shaft 94 extends through a hole in the front panel 56 spaced from coaxial connector 52, and through a bushing portion 96 of the switch frame 84 projecting through such panel. The exterior surface of the bushing portion 96 may be provided with threads for engagement with a nut 98 to clamp such switch frame to the front panel. A knob 100 is secured to the outer end of the third shaft 94 by means of a set screw 102. Thus, rotation of knob 100 also causes rotation of the switch shafts 94, 98 and 14, simultaneously, to change the connection of the input terminal 34 and the output terminal 36 of the attenuator switch assembly between different attenuator sections by rotation of the movable contacts 30 and 32 on the input and output switches.

Figure 3:
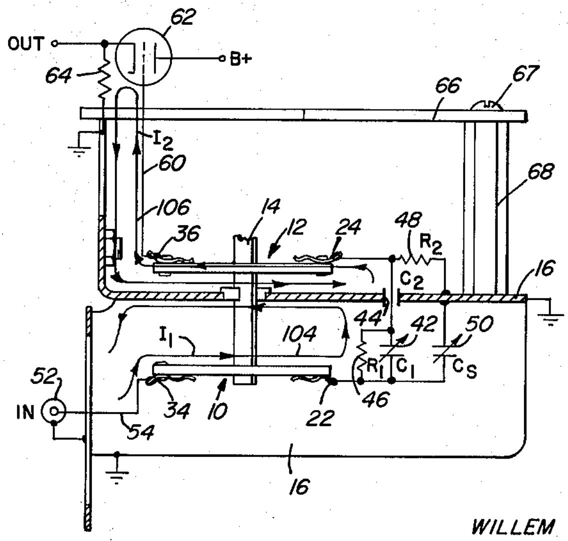
FIG. 3 is a schematic diagram of the attenuator assembly of FIG. 2 showing the current paths in the input and output stages of one attenuator section.

As shown in FIG. 3, when a high voltage, fast rise time pulse is applied to the input terminal of the inner conductor of coaxial connector 52, it produces a high surge current in the attenuator. This produces circulating currents $I_1$ and $I_2$ in the input and output stages, respectively, of the attenuator section whose paths are shown by the arrows 104 and 106, respectively. The input current $I_1$ flows from input lead 54, across the contacts of the input switch 10, through the shunt capacitor $C_s$ to the shield and through input capacitor $C_1$ and the input resistor $R_1$ to the inner conductor of output capacitor $C_2$, and from such inner conductor along the lower side of the shield back to the signal source. The output current $I_2$ flows out of the inner conductor of output capacitor $C_2$, across the contacts of output switch 12, through the output lead 60 and the cathode follower 62, and along the upper side of the shield back to the capacitor $C_2$. However, the use of the inner-stage shield member 16 in the switch assembly of the present invention materially reduces the distortion of high frequency signals by eliminating the mutual inductance effect due to the magnetic fields produced by currents $I_1$ and $I_2$. In addition, by employing a feed through capacitor as the output capacitor $C_2$ the common inductance between the input and output stages is substantially eliminated because the input current $I_1$ flows from the inner conductor of the feed through capacitor to the outer conductor or plate of such capacitor and along the lower side of the shield member 16, while the output current $I_2$ flows along the upper side of such shield and from the outer conductor to the inner conductor of the feed through capacitor. Thus, it can be seen that the circulating currents $I_1$ and $I_2$ have no common path because they flow on opposite sides of the shield member 16 at these high frequencies due to the "skin effect." This means that there is no common voltage drop across the impedance of a common ground path or across the inductance of the leads connecting the feed through capacitor $C_2$ to the input capacitor $C_1$ and ground.

Figure 4:
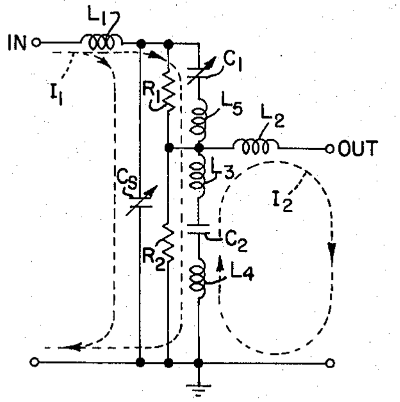
Fig. 4 (PRIOR ART)
FIG. 4 is a schematic diagram of the equivalent electrical circuit of a prior art attenuator section.
Figure 5:
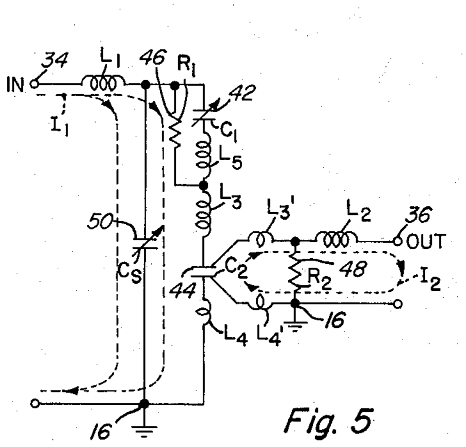
FIG. 5 is a schematic diagram of the equivalent electrical circuit of an attenuator section in accordance with the present invention.

FIGS. 4 and 5 more clearly illustrate the effect of employing the common shield member 16 of the present invention in an RC attenuator. As shown in FIG. 4, previous attenuators not employing the shield member suffered from the defect that the input inductance $L_1$ in series with the input terminal of the input stage of the attenuator was coupled to the output inductance $L_2$ connected in series with the output terminal of the output stage of such attenuator, by the magnetic field produced by input current $I_1$ flowing through such input inductance. This voltage induced in $L_2$ caused distortion of the output signal. In addition, the inductances $L_3$ and $L_4$ of the leads connecting the output capacitor $C_2$ of the output stage between the input capacitor $C_1$ and ground were located in a current path which was common to both the input and output stages of the attenuator. Thus, a portion of the input current $I_1$ and the output current $I_2$ flowed through these common inductances $L_3$ and $L_4$ also causing distortion of the input signal. However, in the equivalent circuit of the attenuator assembly of the present invention, shown in FIG. 5, the mutual inductance between the input and output stages is substantially eliminated so that the magnetic field produced by current $I_1$ flowing through inductance $L_1$ is not coupled to the output inductance $L_2$ due to the fact that the magnetic shield 16 isolates these components as well as the other components of the input and output stages.

Also, by employing a feed through capacitor 44 as the output capacitor $C_2$ of FIG. 5, the output current $I_2$ now flows through lead inductances $L_3'$ and $L_4'$ and not through the inductances $L_3$ and $L_4$ so that there is no common inductance in the input and output stages of the attenuator. In addition, since there is no common ground path for the input and output currents, there can be no voltage drop in the impedance of the ground path which is common to both input and output circuits. As a result, high voltage input signals exceeding 20 megacycles are transmitted through the attenuator sections of the present invention with much less wave form distortion. In should be noted, that at these high frequencies the input and output resistors $R_1$ and $R_2$ of the input and output stages of the attenuator are very large compared to the impedance of the input and output capacitors $C_1$ and $C_2$ connected in parallel with such resistors so that the effect of $R_1$ and $R_2$ can be neglected.

It will be obvious to those having ordinary skill in the art that many changes may be made in the various details of the above described preferred embodiment of the present invention without departing from the spirit of the invention. Therefore, the scope of the present invention should only be determined by the following claims.

I claim:

1. An electrical signal attenuator assembly, comprising:

a plurality of input attenuator stages each including at least one input capacitor connected across an input resistor;

a plurality of output attenuator stages each including at least one output capacitor connected across an output resistor, said output stages being connected to said input stages to provide a plurality of attenuator sections having different attenuation ratios;

switch means for selectively connecting said attenuator sections between the input and output terminals of said assembly; and;

a shield means positioned between said input stages and said output stages to prevent mutual induction between input and output stages due to electro-magnetic field coupling and to reduce common induction due to current flowing through the inductance of the leads connected between the input stages and the output stages.

2. An electrical signal attenuator switch assembly, comprising:

a plurality of input attenuator stages each including at least one input capacitor;

a plurality of output attenuator stages each including at least one output capacitor, said output stages being connected in series with said input stages to provide a plurality of attenuator sections having different attenuation ratios;

first switch means for connecting an input terminal of said switch assembly to different ones of said input stages;

second switch means for connecting an output terminal of said switch assembly to different ones of said output stages;

operating means for changing the connections of said first and second switch means and for coupling said first switch means to said second switch means so that said input terminal and said output terminal are connected to the stages of the same attenuator section; and a common shield means positioned between said first switch means and said second switch means and between the input stage and the output stage of each of said attenuator sections.

3. An electrical signal attenuator switch assembly, comprising:

a plurality of input attenuator stages each including at least one input capacitor connected in parallel with an input resistor;

a plurality of output attenuator stages each including at least one output capacitor connected in parallel with an output resistor, said output stages being connected by leads in series with said input stages to provide a plurality of attenuator sections having different attenuation ratios;

first switch means for connecting an input terminal of said switch assembly to different ones of said input stages;

second switch means for connecting an output terminal of said switch assembly to different ones of said output stages;

coupling means for coupling said first switch means to said second switch means so that said input terminal and said output terminal are connected to the stages of the same attenuator section; and a common shield means positioned between said first switch means and said second switch means and between the input stage and the output stage of each of said attenuator sections, it prevent mutual induction between input and output stages due to electro-magnetic field coupling and to reduce common induction due to current flowing through the inductance of the leads connected between the input stage and the output stage.

4. An electrical signal attenuator switch assembly, comprising:

a plurality of input attenuator stages each including at least one input capacitor connected in parallel with an input resistor;

a plurality of output attenuator stages each including at least one feed through type output capacitor connected in parallel with an output resistor, said output stages being connected by leads in series with said input stages to provide a plurality of attenuator sections having different attenuation ratios;

first rotary switch means having fixed and rotatable contacts for connecting an input terminal of said switch assembly to different ones of said input stages;

second rotary switch means having fixed and rotatable contact for connecting an output terminal of said switch assembly to different ones of said output stages;

coupling means for coupling said first switch means to said second switch means to rotate their rotatable contacts so that said input terminal and said output terminal are connected to the stages of the same attenuator section; and a common shield means positioned between said first switch means and said second switch means and between the input stage and the output stage of each of said attenuator sections, to prevent mutual induction between input and output stages due to electromagnetic field coupling and to reduce common induction due to current flowing through the inductance of the leads connected between the input stage and the output stage.

5. An electrical signal attenuator switch assembly, comprising:

a first rotary switch including a rotor member having at least one movable contact and a stator member having a plurality of fixed contacts;

a second rotary switch similar to said first switch;

a shield member mounted between said first and second rotary switches;

a plurality of input capacitors connected to different ones of the fixed contacts of said first switch to form a plurality of input attenuator stages positioned on the same side of said shield member as said first switch;

a plurality of output capacitors of the feed through type mounted in a plurality of spaced openings through said shield member with one terminal of the inner conductor of each of said output capacitors connected to a different one of said input capacitors and the other terminal of said inner conductor connected to a different one of the fixed contacts of said second switch, and with the outer conductor of each of said output capacitors connected to said shield member to form a plurality of output attenuator stages on the same side of said shield member as second switch;

an input terminal connected to one of the fixed contacts of said second switch; and a common shaft extending through an aperture in said shield member of a diameter slightly larger than said shaft, and connected to the rotor members of said first and second switches to rotate the movable contacts of said switches simultaneously to change the connections of said input and output terminals between different attenuator sections.

6. An electrical signal attenuator switch assembly, comprising:

a first rotary switch including a rotor member having at least one movable switch contact and a stator member having a plurality of fixed switch contacts;

a second rotary switch similar to said first switch;

a shield member mounted between said first and second rotary switches;

a plurality of input resistors connected to different ones of the fixed contacts of said first switch;

a plurality of input capacitors connected in parallel with different ones of said input resistors to form a plurality of input attenuator stages positioned on the same side of said shield member as said first switch;

a plurality of output capacitors of the feed through type mounted in a plurality of spaced openings through said shield member with one terminal of the inner conductor of each of said output capacitors connected to a different one of said input capacitors and the other terminal of said inner conductor connected to a different one of the fixed contacts of said second switch, and with the outer conductor of each of said output capacitors connected to said shield member;

a plurality of output resistors connected between the fixed contacts of said second switch and said shield member to form a plurality of output attenuator stages on the same side of said shield member as said second switch;

an input terminal connected to one of the fixed contacts of said first switch;

an output terminal connected to one of the fixed contacts of said second switch; and a common shaft extending through an aperture in said shield member of a diameter slightly larger than said shaft, and connected to the rotor members of said first and second switches to rotate the movable contacts of said switches together in order to change the connections of said input and output terminals between different attenuator sections.

7. An electrical signal attenuator switch assembly, comprising:

a first rotary switch including a rotor member having at least one movable switch contact and a stator member having a plurality of fixed switch contacts;

a second rotary switch similar to said first switch;

a shield plate member mounted between said first and second rotary switches;

a plurality of input resistors connected to different ones of the fixed contacts of said first switch;

a plurality of variable input capacitors connected in parallel with different ones of said input resistors to form a plurality of input attenuator stages positioned on the same side of said shield member as said first switch;

a plurality of variable shunt capacitors connected between the input terminals of different ones of said input capacitors and said shield members and mounted on the same side of said shield member as said input capacitors;

a plurality of fixed output capacitors mounted on the opposite side of said shield member from said input capacitors with one terminal of each of said output capacitors connected through one of a plurality of spaced openings in said shield member to the output terminal of a different one of said input capacitors and connected to a different one of the fixed contacts of said second switch, and with the other terminal of each of said output capacitors connected to said shield member;

a plurality of output resistors connected between the fixed contacts of said second switch and said shield member to form a plurality of output attenuator stages on the same side of said shield member as said second switch;

an input terminal of said attenuator assembly connected to one of the fixed contacts of said first switch;

an output terminal of said attenuator assembly connected to one of the fixed contacts of said second switch; and a common shaft extending through an aperture in said shield member of a diameter slightly larger than said shaft, and connected to the rotor members of said first and second switches to rotate the movable contacts of said switches together in order to change the connections of said input and output terminals between different attenuator sections.

References Cited by the Examiner

UNITED STATES PATENTS

| | | | |
|---|---|---|---|
| 2,682,018 | 6/54 | Phillips | 174—35 |
| 2,884,597 | 4/59 | Miller | 324—179 |
| 3,081,441 | 3/63 | Paschal | 324—72.5 |

HERMAN KARL SAALBACH, *Primary Examiner.*